(12) United States Patent
Hong et al.

(10) Patent No.: US 6,740,955 B1
(45) Date of Patent: May 25, 2004

(54) TRENCH DEVICE ISOLATION STRUCTURE

(75) Inventors: Soo-Jin Hong, Seoul (KR); Jin-Hwa Heo, Incheon (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 10/431,606

(22) Filed: May 8, 2003

Related U.S. Application Data

(62) Division of application No. 10/121,606, filed on Apr. 15, 2002, now Pat. No. 6,593,207.

(30) Foreign Application Priority Data

Jul. 3, 2001 (KR) .......................... 2001-39446

(51) Int. Cl.⁷ .................. H01L 29/00; H01L 21/8242; H01L 21/76; H01L 21/425
(52) U.S. Cl. .................. 257/506; 257/499; 438/243; 438/244; 438/424; 438/524; 438/430; 438/435
(58) Field of Search .................. 257/499; 438/243, 438/244, 424, 524, 430, 435

(56) References Cited

U.S. PATENT DOCUMENTS

| | | | | |
|---|---|---|---|---|
| 5,937,292 A | * | 8/1999 | Hammerl et al. | 438/243 |
| 6,127,241 A | * | 10/2000 | Rha | 438/437 |
| 2002/0072198 A1 | * | 6/2002 | Ahn | 438/424 |
| 2002/0076879 A1 | * | 6/2002 | Lee et al. | 438/241 |

* cited by examiner

Primary Examiner—John Nebling
Assistant Examiner—Stanetta Isaac
(74) Attorney, Agent, or Firm—Lee & Sterba, P.C.

(57) ABSTRACT

A method of forming a trench device isolation structure, wherein, after forming a trench in a predetermined area of a semiconductor substrate, a lower isolation pattern, an upper liner pattern, and an upper isolation pattern are sequentially formed to fill the trench. A lower device isolation layer is formed on an entire surface of the semiconductor substrate, and then etched to form the lower isolation pattern so that a top surface of the lower isolation pattern is lower than a top surface of the semiconductor substrate. An upper liner layer and an upper device isolation layer are formed on the entire surface of the semiconductor substrate including the lower isolation pattern, and then etched to form the upper liner pattern. As a result, the upper liner pattern covers the top surface of the lower isolation pattern and surrounds the bottom and the sidewall of the upper isolation pattern.

11 Claims, 7 Drawing Sheets

TRENCH DEVICE ISOLATION STRUCTURE

This is a division of Ser. No. 10/121,862 filed Apr. 15, 2002 now U.S. Pat. No. 6,593,207.

BACKGROUND OF THE INVENTION

1. Field of the Invention

The present invention relates generally to a semiconductor device. More particularly, the present invention relates to a trench isolation structure and a method of forming the same.

2. Description of the Related Art

As the size of a semiconductor device becomes smaller, an aspect ratio of a trench intended for device isolation increases. A trench having a high aspect ratio may be filled with multiple layers of materials.

Disadvantages of forming a conventional trench isolation layer are described below with reference to FIGS. 1 and 2.

Referring to FIG. 1, a trench mask pattern 20 is formed on a semiconductor substrate 10. Using the trench mask pattern 20 as an etching mask, the substrate 10 is anisotropically etched to form a trench 30. During the formation of the trench 30, the substrate 10 is subjected to damage. In order to remove this etching damaged region, a wall of the trench 30 is subjected to a thermal oxidation process to form an oxide layer 40.

A lower device isolation layer of polysilicon or spin-on-glass (SOG) is formed on an entire surface of the semiconductor substrate including the thermal oxide layer 40. The lower device isolation layer is etched so that a top surface of the lower device isolation layer is at a lower level than a top surface of the substrate 10. As a result, a lower isolation pattern 50 is formed to fill a lower portion of the trench 30. An upper device isolation layer 60 formed of high density plasma (HDP) oxide or undoped silicate glass (USG) is formed on an entire surface of the semiconductor substrate including the lower isolation pattern 50.

A very high aspect ratio prevents an HDP oxide film or a USG film from filling the trench 30, therefore, it is necessary to reduce the aspect ratio of the trench 30. The lower isolation pattern is intended for this purpose. The lower isolation pattern 50 is preferably made of a material with better filling characteristics, such as polysilicon or SOG. Thus, the aspect ratio of the trench 30 is reduced by the lower isolation pattern 50, thereby enabling the upper device isolation layer 60 to fill the upper portion of the trench 30.

Referring now to FIG. 2, the trench mask pattern 20 is exposed by etching the upper device isolation layer 60 to form an upper isolation pattern 61. The exposed trench mask pattern 20 is then removed to expose the top surface of the semiconductor substrate 10. Next, a thermal oxidation process is carried out to form a gate oxide layer 70 on the exposed top surface of the substrate 10.

If the lower isolation pattern 50 is made of polysilicon, the polysilicon reacts with oxygen to form silicon oxide in subsequent thermal oxidation processes including the process for forming the gate oxide layer 70. It is well known that when a silicon oxide layer is formed by oxidizing silicon, the volume thereof increases. Hence, oxidation of the lower isolation pattern 50 made of polysilicon causes a stress to be applied to the substrate 10. Due to this stress, the substrate 10 may suffer from lattice damage 80, thereby degrading the characteristics of the semiconductor devices made in the substrate.

Alternatively, if the lower isolation pattern 50 is made of SOG, which is a liquid-phase material containing siloxanes or silicates mixed with solvent, an annealing step for evaporating the solvent is needed in order to use the SOG as an insulator. During this annealing step and during other subsequent high temperature processing steps, the carbon-containing materials may diffuse into the substrate 10. If the carbon-containing materials diffuse into the substrate, electrical characteristics of a semiconductor device become unstable.

SUMMARY OF THE INVENTION

The present invention provides a novel trench device isolation structure and a method of forming the same. The novel trench device isolation structure suppresses the oxidation and the consequent expansion of a lower isolation pattern that otherwise may create stress in the substrate. The novel trench device isolation structure also prevents diffusion of impurities from the lower isolation pattern into the substrate.

According to an aspect of an embodiment of the present invention, a method of forming a trench device isolation structure includes forming a trench in a predetermined area of a semiconductor substrate to define an active region; forming a lower isolation pattern having a top surface at a lower level than a top surface of the semiconductor substrate; and forming an upper liner pattern to cover an upper portion of an inner sidewall of the trench and the top surface of the lower isolation pattern and an upper isolation pattern to fill an area surrounded by the upper liner pattern. According to a feature of an embodiment of the present invention, a thermal oxide layer may be formed on an inner sidewall of the trench following the formation of the trench. This method may further include forming a lower liner on an entire surface of the semiconductor substrate including the trench following the formation of the trench or following the formation of the thermal oxide layer.

According to an embodiment of the present invention, forming the lower isolation pattern in the method of forming a trench device isolation structure may further include forming a lower device isolation layer on the entire surface of the semiconductor substrate including the trench to fill the trench; and etching the lower device isolation layer until a top surface of the lower device isolation layer is at a level lower than a top surface of the active region in the trench.

According to another aspect of an embodiment of the present invention, forming the upper liner pattern and the upper isolation pattern in the method of forming a trench isolation structure may include forming an upper liner on an entire surface of a semiconductor substrate, including the lower isolation pattern; forming an upper device isolation layer on the upper liner; and sequentially etching the upper device isolation layer and the upper liner to expose the top surface of the semiconductor substrate. In yet another aspect of an embodiment of the present invention, a low pressure chemical vapor deposition (LPCVD) oxide layer is formed on the upper liner prior to the formation of the upper device isolation layer, and a tetra-ethyl-ortho-silicate (TEOS) layer is formed on the upper device isolation layer.

According to a feature of an embodiment of the present invention, forming a trench in the method of forming a trench isolation structure may include forming a pad oxide layer, a polish-stop layer, and a hard mask layer sequentially on the semiconductor substrate; patterning the hard mask layer, the polish-stop layer, and the pad oxide layer sequentially to form a trench mask pattern; and anisotropically etching the substrate. According to yet another feature of an embodiment of the present invention, the trench mask pattern includes an anti-reflective film pattern formed on the hard mask layer pattern. According to still another feature of an embodiment of the present invention, the anti-reflective film pattern and the hard mask layer pattern are removed during the substrate etching; and the polish-stop layer pattern and the pad oxide layer pattern are isotropically etched.

In accordance with some of the features of an embodiment of the present invention, the upper liner pattern and the lower liner pattern are preferably made of a material having a good oxygen and other impurities diffusion blocking property, such as silicon nitride; the lower isolation pattern is preferably made of a material having a good filling property, such as polysilicon, silicon-on-glass (SOG), boro-phospho-silicate glass (BPSG), phospho-silicate glass (PSG), boro-silicate glass (BSG), and tetra-ethyl-ortho-silicate (TEOS); the upper isolation pattern is preferably made of an insulator that is stable during a thermal process, such as high density plasma (HDP) oxide or undoped silicate glass (USG).

According to yet still another embodiment of the present invention, a device isolation structure includes a trench formed in a predetermined area of a semiconductor substrate to define an active region; a lower isolation pattern having a top surface that is at a lower level than a top surface of the active region, the lower isolation pattern being formed in the trench; and an upper isolation pattern formed on the lower isolation pattern, wherein a sidewall and a bottom of the upper isolation pattern are surrounded by the upper liner pattern. The above isolation structure may further include a thermal oxide layer covering the inner sidewall of the trench.

In one of the aspects of an embodiment of the present invention, the device isolation structure includes a lower liner pattern covering an inner wall of the trench. In another aspect of an embodiment of the present invention, a thermal oxide layer intervenes between the lower liner pattern and the semiconductor substrate.

These and other features and advantages of the present invention will be readily apparent to those of ordinary skill in the art upon review of the detailed description that follows.

DETAILED DESCRIPTION OF THE INVENTION

Figure 1:
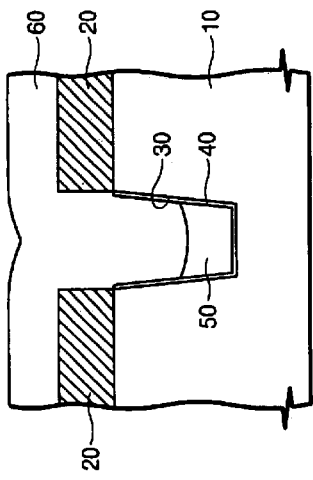
FIGS. 1 and 2 illustrate cross-sectional flow diagrams of a trench isolation structure formed using a conventional technique.
Figure 2:
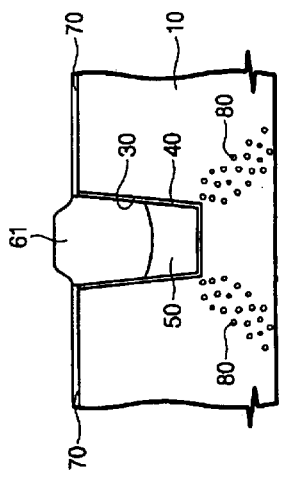

Korean Patent Application No. 2001-39446, filed on Jul. 3, 2001, and entitled: "Trench Isolation Structure and a Method of Forming the Same," is incorporated by reference herein in its entirety.

The present invention will now be described more fully hereinafter with reference to the accompanying drawings, in which preferred embodiments of the invention are shown. The present invention may, however, be embodied in different forms and should not be construed as limited to the embodiments set forth herein. Rather, these embodiments are provided so that this disclosure will be thorough and complete, and will fully convey the scope of the invention to those of ordinary skill in the art. In the drawings, the thickness of layers and regions may be exaggerated for clarity. It will also be understood that when a layer is referred to as being "on" another layer or substrate, it may be directly on the other layer or substrate, or intervening layers may also be present. Like reference characters refer to like elements throughout.

Steps of forming a device isolation structure according to an embodiment of the present invention are illustrated in FIGS. 3 through 10.

Figure 3:
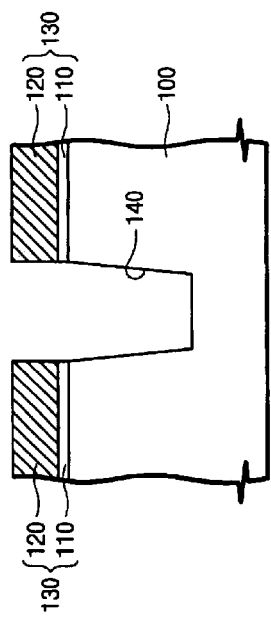
FIGS. 3 to 10 illustrate cross-sectional flow diagrams of steps of forming a device isolation structure according to the present invention.

Referring to FIG. 3, a pad oxide layer, a polish-stop layer, and a hard mask layer are sequentially stacked on a semiconductor substrate 100. The hard mask layer, the polish-stop layer, and the pad oxide layer are sequentially patterned to form a trench mask pattern 130 including a hard mask layer pattern (not shown), a polish-stop layer pattern 120, and a pad oxide layer pattern 110. Using the trench mask pattern 130 as an etching mask, the substrate 100 is anisotropically etched to form a trench 140 defining an active region.

The trench mask pattern 130 may further include an anti-reflective film pattern (not shown) formed on top of the hard mask layer pattern (not shown). The anti-reflective film pattern, the hard mask layer pattern, and the polish-stop layer pattern 120 are preferably made of silicon oxynitride, silicon oxide, and silicon nitride, respectively. In order to facilitate a subsequent planarization process, the anti-reflective film pattern and the hard mask layer pattern are preferably removed during the etching process for forming the trench 140.

The aspect ratio of the trench 140 is sufficiently high that the trench 140 is not able to be filled in one step using a conventional technique for forming a device isolation layer. In the present invention, an aspect ratio of an area surrounded by the trench mask pattern 130 and the inner wall of the trench 140 is 4 or higher.

Figure 4:
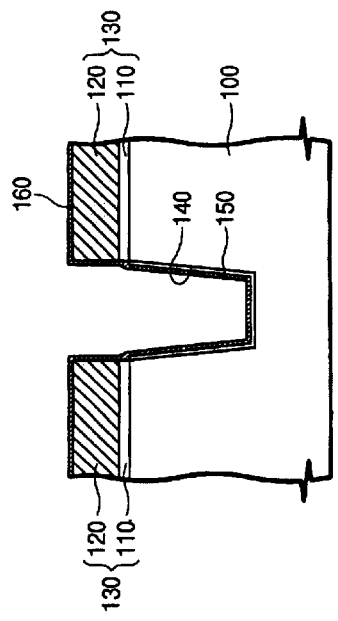

Referring now to FIG. 4, a selective thermal oxidation process is carried out to form a thermal oxide layer 150 on the inner wall of the trench 140. A lower liner 160 is formed on the entire surface of the semiconductor substrate including the thermal oxide layer 150.

During the etching process for forming the trench 140, the semiconductor substrate 100 is damaged. Preferably, the thermal oxide layer 150 has a thickness of 110 Å in order to remove the etching damage of the substrate 100.

The lower liner 160 is made of a material layer that blocks impurities contained in a subsequently formed lower isolation pattern from entering into the semiconductor substrate 100. Therefore, the lower liner 160 is preferably made of silicon nitride having better impurity diffusion barrier characteristics than the thermal oxide layer 150. The lower liner is formed by a low pressure chemical vapor deposition (LPCVD) technique. Preferably, the lower liner 160 has a thickness in the range of approximately 30 Å to 150 Å in order to block diffusion of the impurities into the substrate 100 and to enable the lower liner 160 to have a minimal influence on the aspect ratio of the trench 140.

Figure 5:
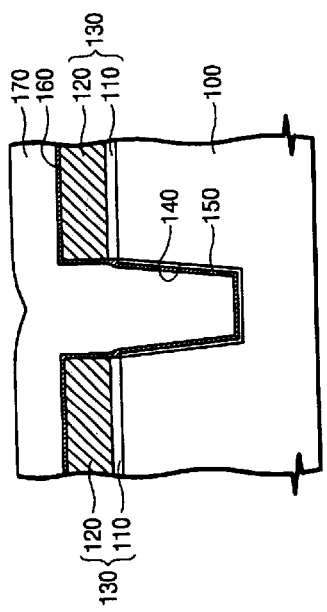

Referring now to FIG. 5, a lower device isolation layer 170 is formed on the entire surface of the semiconductor substrate including the lower liner 160. Although the device isolation layer is conventionally made of HDP oxide or USG, the trench 140 having an aspect ratio of 4 or higher cannot be filled with the HDP oxide or USG. As described in the prior art, the lower device isolation layer 170 is used to reduce the aspect ratio of an area that is surrounded by the wall of trench 140 and the trench mask pattern 130. An additional process step for recessing the lower device isolation layer 170 is needed. The lower device isolation layer 170 must have a characteristic of filling the area without forming voids. Therefore, the lower device isolation layer 170 is preferably made of polysilicon or SOG and may also be made of at least one material selected from the group consisting of boro-phosphosilicate glass (BPSG), phosphosilicate glass (PSG), borosilicate glass (BSG), and tetraethyl orthosilicate (TEOS).

The layers of SOG, BPSG, PSG, and TEOS may contain impurities such as solvents or carbon. If these impurities are diffused into the semiconductor substrate 100, then characteristics of semiconductor devices formed therein become unstable. Forming the lower liner 160 between the lower device isolation layer 170 and the sidewall and the bottom of the trench 140 may prevent the above problem.

Figure 6:
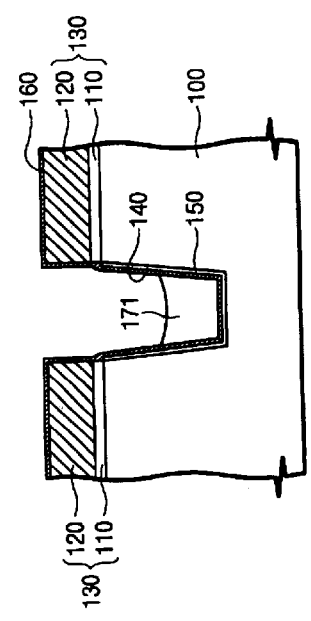

Referring now to FIG. 6, the lower device isolation layer 170 is etched to form a lower isolation pattern 171 having a top surface at a lower level than a top surface of the semiconductor substrate 100. Preferably, the lower device isolation layer 170 is recessed so that an aspect ratio of the area surrounded by the sidewall of the lower liner 160 above the lower isolation pattern 171 is 3 or less. This condition is required because the aspect ratio of an area that may be filled with a device isolation layer made of HDP oxide or USG is limited to 3 or less according to the conventional technology. Preferably, the lower device isolation layer 170 is etched using an etch recipe that is selective to the lower liner 160.

Figure 7:
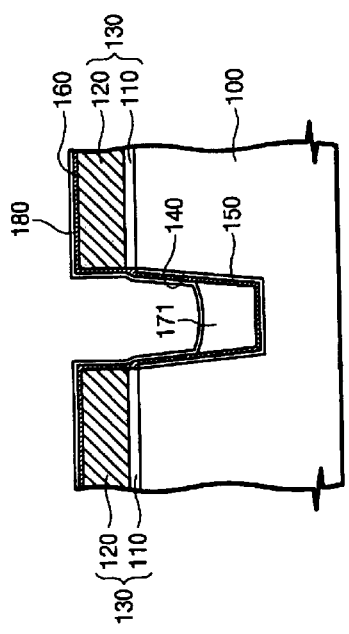

Referring now to FIG. 7, an upper liner 180 is formed on the entire surface of the semiconductor substrate including the lower isolation pattern 171. Similar to the lower liner 160, the upper liner 180 is preferably made of silicon nitride using the LPCVD technique. Therefore, the lower isolation pattern 171 is completely surrounded by the upper and lower liners, 180 and 160.

The upper liner 180 is also a diffusion barrier layer similar to the lower liner 160, and blocks oxygen penetration into the lower isolation pattern 171. Therefore, even if the lower isolation pattern 171 is made of polysilicon, the upper liner 180 prevents a stress, which results from a volume expansion that occurs when the lower isolation pattern 171 is oxidized during a subsequent oxidation process.

Figure 8:
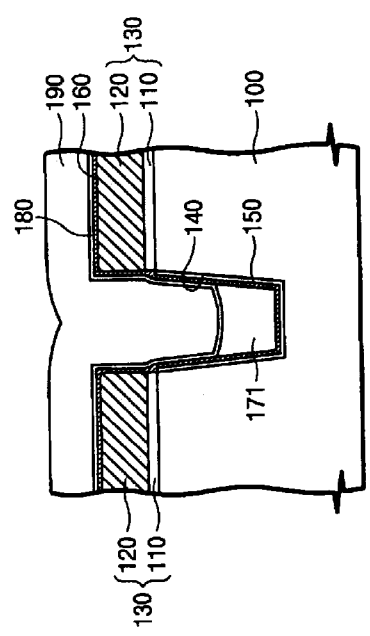

Referring now to FIG. 8, an upper device isolation layer 190 is formed on the upper liner 180 In the conventional technique, the upper device isolation layer 190 is made of HDP oxide or USG. Since the aspect ratio of the area is lowered by the lower isolation pattern 171, the area is able to be filled with HDP oxide or USG without the formation of voids.

If the upper device isolation layer 190 is made of HDP oxide, the surface of the upper liner 180 suffers from a plasma damage. To prevent the plasma damage, another LPCVD oxide layer may be formed on the upper liner 180 to a thickness of 100 Å prior to the formation of the HDP oxide upper device isolation layer 190.

Figure 9:
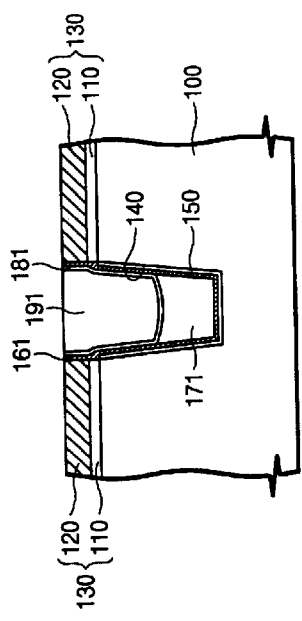

Referring now to FIG. 9, the upper device isolation layer 190, the upper liner 180, and the lower liner 160 are sequentially etched down to the top surface of the polish-stop layer pattern 120, forming an upper isolation pattern 191, an upper liner pattern 181, and a lower liner pattern 161. Thus, the sidewall and the bottom surface of the upper isolation pattern 191 are surrounded by the upper liner pattern 181, and the sidewall of the upper liner pattern 181 is surrounded by the lower liner pattern 161. As shown in FIG. 9, the lower isolation pattern 171 is surrounded by the upper and lower liner patterns 181 and 161.

Preferably, the etching of upper device isolation layer 190, the upper liner 180 and the lower liner 160 is performed by a chemical mechanical polishing (CMP) technique. A large height difference between the top surfaces of the upper isolation pattern 191 and the semiconductor substrate 100 may complicate subsequent processing. Accordingly, it is desirable to lower the height of the upper isolation pattern 191.

For the formation of the upper isolation pattern 191, the polish-stop layer pattern 120 is used as an etch-stop layer in the etching process. If the upper device isolation layer 190 is made of HDP oxide, it may have a wave-shaped top surface as shown in FIG. 8. Etching the upper device isolation layer 190 in this case may result in a non-planar upper device isolation pattern 191. Hence, a TEOS layer may be formed on the HDP oxide layer.

Figure 10:
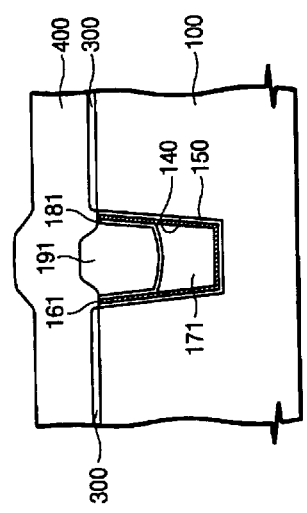

Referring to FIG. 10, the polish-stop layer pattern 120 and the pad oxide layer pattern 110 are sequentially etched to expose the top surface of the semiconductor substrate 100.

In this case, the polish-stop layer pattern 120 is isotropically etched using a silicon nitride etch recipe selective to silicon oxide. If the polish-stop layer pattern 120 is not completely etched, the subsequent process of etching the pad oxide layer pattern 110 will not be properly performed. Therefore, it is desirable that the polish-stop layer pattern 120 is overetched to expose the top surface of the pad oxide layer pattern 110 completely.

As described above, because the upper and lower liner patterns 181 and 161 are made of silicon nitride, they are also etched while etching the polish-stop layer pattern 120. Thus, the top edges of the upper and lower liner patterns 181 and 161 are aligned with the top surface of the substrate 100.

The pad oxide layer pattern 110, the top surface thereof having been exposed, is removed by an isotropic oxide etch recipe that is selective to silicon. The upper isolation pattern 191 is also etched during this process step resulting in a rounded upper corner.

A gate oxide layer 300 is formed on the exposed surface of the substrate 100. Preferably, the gate oxide layer 300 is formed by thermal oxidation in an oxygen ambient at a temperature of approximately 900° C. or higher. If the lower isolation pattern 171 is made of polysilicon, it may be a concern that a volume expansion of the polysilicon, and thereby a stress, may occur in such a high temperature oxidation process. However, the upper liner pattern 181 formed on the lower isolation pattern 171 blocks the diffusion of oxygen into the lower isolation pattern 171 and thereby prevents the volume expansion of the polysilicon, as described earlier in the description of FIG. 7.

Conventionally, gate patterns 400 are formed on the upper isolation pattern 191. Using the gate patterns 400 as ion implanting masks, a junction area is then formed in the active region between the gate patterns 400.

Although a case of using both the upper and the lower liner patterns 181 and 161 has been described so far, a trench device isolation structure having only an upper liner pattern may also be formed. A method of forming the trench device isolation structure having only the upper liner pattern includes the same steps as shown in FIG. 3 through FIG. 10 except that forming the lower liner 160 after forming the thermal oxide layer of FIG. 4 is omitted, and the step of forming the lower device isolation layer 170 of FIG. 5 is directly carried out.

As described above, if the lower isolation pattern 171 is made of polysilicon, the upper liner pattern 181 is formed for preventing oxygen from penetrating into the lower isolation pattern 171. The lower liner pattern 161 does not help to block the penetration of the oxygen. Therefore, if the lower isolation pattern 171 is made of polysilicon, it is preferable that only the upper liner pattern 181 is formed, and the lower liner pattern 161 is omitted.

On the other hand, impurity diffusion into the substrate 100 may occur from the layers of SOG, BPSG, PSG, BSG, and TEOS used for forming the lower isolation pattern 171 during subsequent processing steps. Accordingly, it is preferable to form both the upper and lower liner patterns 181 and 161 to obtain better device characteristics.

Figure 11A:
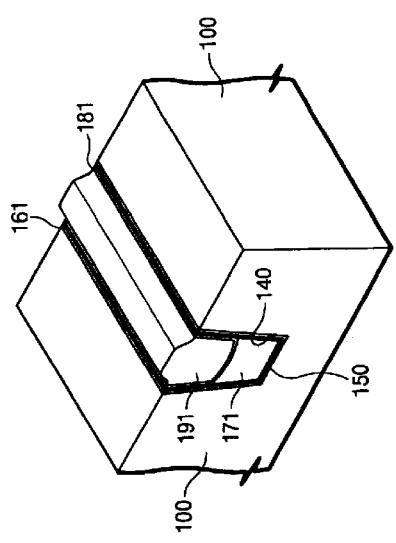
FIG. 11A illustrates a sectional view of a device isolation structure according to an embodiment of the present invention.

A device isolation structure according to an embodiment of the present invention will be described with reference to FIG. 11A. A trench 140 is formed in a predetermined area of a semiconductor substrate 100 to define an active region. A thermal oxide layer 150 is conformally formed on the inner wall of the trench 140 to a thickness of, preferably, 110 Å. A lower liner pattern 161 is conformally formed on an inner wall of the thermal oxide layer 150. Since the thermal oxide layer 150 and the lower liner pattern 161 are sequentially and conformally formed on the inner wall of the trench, their profile is similar to that of the trench 140. As a result, the lower liner pattern 161 and the thermal oxide layer 150 are generally U-shaped.

A lower isolation pattern 171 is formed to partially fill the U-shaped lower liner pattern 161. A top surface of the lower isolation pattern 171 is at a lower level than the top surface of the substrate 100. Another U-shaped upper liner pattern 181 is formed on the top surface of the lower isolation pattern 171. Accordingly, the upper liner pattern 181 covers not only the top surface of the lower isolation pattern 171 but also the upper portion of the inner sidewall of the lower liner pattern 161 that is not covered by the lower isolation pattern 171. As a result, the lower isolation pattern 171 is surrounded by the upper and lower liner patterns 181 and 161. Preferably, the upper and lower liner patterns 181 and 161 are made of silicon nitride to a thickness in the range of approximately 30 Å to 150 Å.

The upper liner pattern 181 is filled with the upper isolation pattern 191. Although a top surface of the upper isolation pattern 191 is at a higher level than the top surface of the substrate 100, a small height difference is preferable. Also the top surface of the upper isolation pattern 191 is preferably rounded.

Preferably, the lower isolation pattern 171 is made of at least one material selected from the group consisting of polysilicon, SOG, BPSG, PSG, BSG, and TEOS, and the upper isolation pattern 191 is made of HDP oxide or USG. If the upper isolation pattern 191 is made of HDP oxide, another LPCVD oxide layer is preferably formed between the upper liner pattern 181 and the upper isolation pattern 191.

Figure 11B:
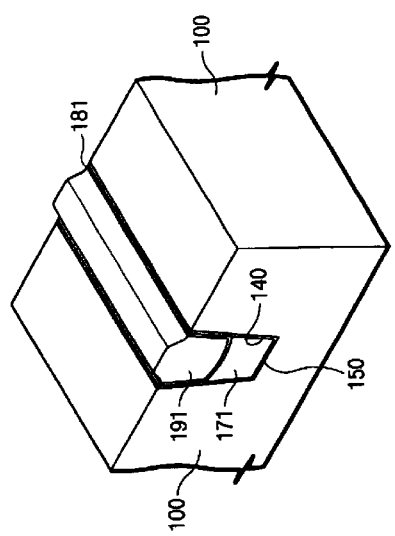
FIG. 11B illustrates a sectional view of a device isolation structure according to another embodiment of the present invention.

A device isolation structure having only an upper liner pattern will be described with reference to FIG. 11B. A trench 140 is formed in a predetermined area of a semiconductor substrate 100 to define an active region. A thermal oxide layer 150 is conformally formed on an inner wall of the trench 140 to be generally U-shaped. A lower isolation pattern 171 is formed to partially fill the U-shaped area that is surrounded by the thermal oxide layer 150. A top surface of the device isolation pattern 171 is at a lower level than that of the substrate 100. An upper liner pattern 181 is formed to cover not only the top surface of the lower isolation pattern 171 but also an upper portion of the inner sidewall of the thermal oxide layer 150 that is not covered by the lower isolation pattern 171. Therefore, the upper liner pattern 181 is also generally U-shaped. Preferably, the upper liner pattern 181 is made of silicon nitride.

The upper liner pattern 181 is filled with an upper isolation pattern 191. Although a top surface of the upper isolation pattern 191 is at a higher level than that of the substrate 100, a small height difference between these two top surfaces is preferable. Preferably, the lower isolation pattern 171 is made of at least one material selected from a group consisting of SOG, BPSG, PSG, BSG, and TEOS, and the upper isolation pattern 191 is made of HDP oxide or USG.

Figure 12:
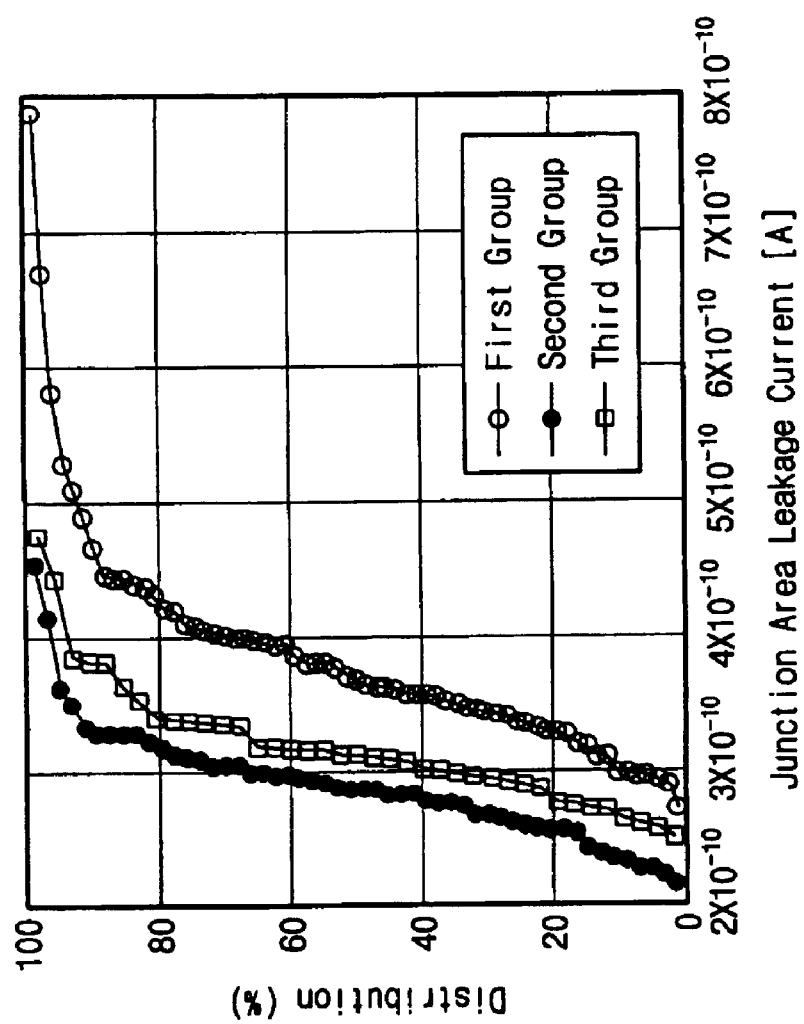
FIG. 12 illustrates a graphical representation of the test results of various device isolation structures manufactured according to the present invention.

FIG. 12 is a graph illustrating results of the tests that were performed to evaluate the influence of the upper liner and the lower liner patterns on the characteristics of semiconductor devices. For the case where the lower isolation pattern 171 was made of polysilicon, a leakage current was measured by classifying three groups, i.e., with only a lower liner pattern, with both an upper and lower liner pattern, and with only a lower liner pattern. The leakage current was measured by applying a reverse voltage of 3.5 V to the junction area. The junction area was formed by introducing arsenic (As) at a dose of $3 \times 10^{15}$ ions/cm$^2$ at an ion energy of 20 keV. In this test, the junction area is 624.24 ($\mu$m)$^2$.

The first group represents results of a test on samples having the lower liner pattern 161 but no upper liner pattern 181. The second group represents results of a test on samples having both the lower and upper liner patterns 161 and 181. A third group represents results of a test on samples having the upper liner pattern 181 but no the lower liner pattern 161. In order to exclude errors involved in a single measurement on each wafer, the first, the second, and the third groups are formed from the results that were measured at 65, 52, and 39 points in 5, 4, and 3 wafers, respectively.

In brief, the test results of FIG. 12 are shown in the following table.

TABLE 1

Leakage current with/without upper and lower liner patterns

| | Lower Liner Pattern | Upper Liner Pattern | Average of Leakage Current ($10^{-10}$ A) |
| --- | --- | --- | --- |
| First Group | exists | does not exist | 3.88 |
| Second Group | exists | exists | 2.90 |
| Third Group | does not exist | exists | 3.19 |

The average of leakage current is lowest in the second group, and highest in the first group. That is, the best results were obtained in the second group where both the lower and the upper liner patterns 161 and 181 are present. The third group had a lower leakage current than the first group. This result shows that when the lower isolation pattern 171 is made of polysilicon, a characteristic blocking diffusion of oxygen is accomplished by only the upper liner pattern 181.

As explained so far, a silicon nitride layer covers or surrounds a lower isolation pattern that may cause stress to the substrate or may cause impurity diffusion into the substrate. The silicon nitride layer is formed to prevent oxygen from diffusing into the lower isolation pattern or to prevent impurity diffusion from the lower isolation pattern into the semiconductor substrate. Therefore, it is possible to minimize deterioration of semiconductor device characteristics that are caused by a stress related damage to the substrate or diffusion of impurities into the substrate.

In one of the embodiments of the present invention, the lower liner is formed on the inner wall of the trench without an oxide layer therebetween.

Preferred embodiments of the present invention have been disclosed herein and, although specific terms are employed, they are used in a generic and descriptive sense only and not for purpose of limitation. Accordingly, if will be understood by those of ordinary skill in the art that various changes in form and details may be made without departing from the spirit and scope of the present invention as set forth in the following claims.

What is claimed is:

1. A device isolation structure comprising:
   a trench formed in a predetermined area of a semiconductor substrate to define an active region;
   a lower isolation pattern having a top surface that is at a lower level than a top surface of the active region, the lower isolation pattern being formed in the trench; and
   an upper isolation pattern formed on the lower isolation pattern, wherein a sidewall and a bottom of the upper isolation pattern are surrounded by an upper liner pattern.

2. A device isolation structure as claimed in claim 1, further comprising a thermal oxide layer covering an inner wall of the trench.

3. A device isolation structure as claimed in claim 1, further comprising a lower liner pattern covering an inner wall of the trench.

4. A device isolation structure as claimed in claim 3, further comprising a thermal oxide layer intervened between the lower liner pattern and the semiconductor substrate.

5. A device isolation structure as claimed in claim 1, wherein the upper liner pattern is made of silicon nitride.

6. A device isolation structure as claimed in claim 1, wherein the thickness of the upper liner pattern is in the range of approximately 30 Å to 150 Å.

7. A device isolation structure as claimed in claim 3, wherein the thickness of the lower liner pattern is in the range of approximately 30 Å to 150 Å.

8. A device isolation structure as claimed in claim 3, wherein the lower liner pattern is made of silicon nitride.

9. A device isolation structure as claimed in claim 1, wherein the lower isolation pattern is made of at least one material selected from the group consisting of polysilicon, SOG, BPSG, PSG, BSG, and TEOS.

10. A device isolation structure as claimed in claim 1, wherein the upper isolation pattern is made of high density plasma (HDP) oxide or USG.

11. A device isolation as claimed in claim 10, wherein an LPCVD oxide layer is formed between the upper liner pattern and the HDP upper isolation pattern.

* * * * *

UNITED STATES PATENT AND TRADEMARK OFFICE
CERTIFICATE OF CORRECTION

PATENT NO. : 6,740,955 B1 Page 1 of 1
DATED : May 25, 2004
INVENTOR(S) : Soo-Jin Hong et al.

It is certified that error appears in the above-identified patent and that said Letters Patent is hereby corrected as shown below:

Title page,
Item [62], Related U.S. Application Data, should read
-- [62] Divison of application No. 10/121,862, filed on Apr. 15, 2002, now Pat. No. 6,593,207 B2. --

Signed and Sealed this

Fifth Day of July, 2005

JON W. DUDAS
*Director of the United States Patent and Trademark Office*